US008697563B2

(12) United States Patent
Hwang

(10) Patent No.: US 8,697,563 B2
(45) Date of Patent: Apr. 15, 2014

(54) METHOD FOR FORMING SEMICONDUCTOR DEVICE HAVING MULTIPLE ACTIVE LAYER STRUCTURE

(75) Inventor: Yun Taek Hwang, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 13/278,350

(22) Filed: Oct. 21, 2011

(65) Prior Publication Data

US 2012/0040506 A1    Feb. 16, 2012

Related U.S. Application Data

(62) Division of application No. 12/135,306, filed on Jun. 9, 2008, now abandoned.

(30) Foreign Application Priority Data

Feb. 29, 2008  (KR) ................... 10-2008-0018879

(51) Int. Cl.
*H01L 21/44* (2006.01)

(52) U.S. Cl.
USPC ........... 438/598; 438/151; 438/269; 438/279; 438/481; 438/597

(58) Field of Classification Search
USPC ....... 438/269, 481, FOR. 426, 151, 279, 597, 438/598
See application file for complete search history.

(56) References Cited

U.S. PATENT DOCUMENTS

| | | | | |
|---|---|---|---|---|
| 5,949,110 | A * | 9/1999 | Arima ........................... | 257/368 |
| 6,316,368 | B1 * | 11/2001 | Lin et al. ...................... | 438/720 |
| 6,429,484 | B1 * | 8/2002 | Yu ................................ | 257/347 |
| 2002/0119640 | A1 | 8/2002 | Gonzalez | |
| 2003/0176049 | A1 | 9/2003 | Hegde et al. | |
| 2005/0136594 | A1 * | 6/2005 | Kim .............................. | 438/257 |
| 2006/0028861 | A1 | 2/2006 | Han et al. | |
| 2006/0079059 | A1 * | 4/2006 | Snyder et al. ................. | 438/288 |
| 2006/0270215 | A1 * | 11/2006 | Lee et al. ...................... | 438/637 |

(Continued)

FOREIGN PATENT DOCUMENTS

| KR | 10-2006-0097892 | 9/2006 |
|---|---|---|
| KR | 10-0634459 | 10/2006 |
| KR | 10-0727255 | 6/2007 |
| KR | 20070128347 | 11/2007 |

OTHER PUBLICATIONS

U.S. Appl. No. 12/134,114, filed Jun. 5, 2008.
U.S. Appl. No. 12/134,280, filed Jun. 6, 2008.

*Primary Examiner* — Anthony Ho
*Assistant Examiner* — David Chen
(74) *Attorney, Agent, or Firm* — Marshall, Gerstein & Borun LLP

(57) ABSTRACT

A method for manufacturing a semiconductor device includes forming a transistor having a stacked structure in a peripheral circuit region to increase net die and forming a metal silicide layer over a source/drain region of a transistor formed over an upper layer to reduce a contact resistance. The semiconductor device may include: a second active region including a silicon layer connected to a first active region of a semiconductor substrate; a gate formed over the second active region; a spacer formed on sidewalls of the gate; a source/drain region form at both sides of the spacer; and a metal silicide layer formed over the gate and the source/drain region.

9 Claims, 4 Drawing Sheets

(56) References Cited

U.S. PATENT DOCUMENTS

| | | | |
|---|---|---|---|
| 2007/0141798 A1 * | 6/2007 | Bohr | 438/301 |
| 2007/0164354 A1 | 7/2007 | Ko et al. | |
| 2007/0181953 A1 | 8/2007 | Lyu et al. | |
| 2008/0301940 A1 | 12/2008 | Wirth | |

* cited by examiner

METHOD FOR FORMING SEMICONDUCTOR DEVICE HAVING MULTIPLE ACTIVE LAYER STRUCTURE

CROSS-REFERENCE TO RELATED APPLICATION

This is a division of U.S. application Ser. No. 12/135,306 filed Jun. 9, 2008, which claims the priority benefit under USC 119 of KR 10-2008-0018879, filed on Feb. 29, 2008, the entire respective disclosures of which are incorporated herein by reference.

BACKGROUND OF THE INVENTION

The present invention relates to a semiconductor device and a method for manufacturing a semiconductor device, and more specifically, to a technology of forming a transistor having a stacked structure in a peripheral circuit region to increase net die and forming a metal silicide layer over a source/drain region of a transistor formed over an upper layer to reduce a contact resistance.

Due to high integration of semiconductor devices, an area occupied by a device has been reduced. As a result, a transistor size becomes smaller, a space between a source region and a drain region becomes narrower, and a channel length becomes shorter. Also, a size of a contact plug that contacts with the source/drain region of the transistor is reduced.

When the size of the contact plug is reduced, a contact resistance (Rc) between a silicon substrate and the contact plug is increased. As a result, a current characteristic of the device is degraded obstructing high speed operation of the device.

SUMMARY OF THE INVENTION

Various embodiments of the present invention are directed at forming a transistor to have a stacked structure in a peripheral circuit region to increase net die.

Various embodiments of the present invention are directed at forming a metal silicide layer over a gate of a transistor formed over an upper layer in a peripheral circuit region.

Various embodiments of the present invention are directed at forming a metal silicide layer over a source/drain region of a transistor formed over an upper layer in a peripheral circuit region.

Various embodiments of the present invention are directed at forming a gate insulating film including a high dielectric (Hi-K) material of a transistor formed over an upper layer in a peripheral circuit region to improve performance of the transistor.

According to an embodiment of the present invention, a semiconductor device may include: a second active region including a silicon layer connected to a first active region of a semiconductor substrate; a gate formed over the second active region; a spacer formed on sidewalls of the gate; a source/drain region form at both sides of the spacer; and a metal silicide layer formed over the gate and the source/drain region. The gate includes a polysilicon layer. The metal silicide layer may include one selected from a titanium silicide layer, a cobalt silicide layer, a nickel silicide layer, a tungsten silicide layer and combinations thereof.

According to an embodiment of the present invention, a method for manufacturing a semiconductor device may include: forming a second active region including a silicon layer connected to a first active region of a semiconductor substrate; forming a gate over the second active region; forming a spacer on sidewalls of the gate; forming a source/drain region at both sides of the spacer; and forming a metal silicide layer over the gate and the source/drain region.

The forming-a-second-active-region may include: forming an interlayer insulating film over the first active region; selectively etching the interlayer insulating film to form a contact hole that exposes the first active region; and growing a silicon layer over the interlayer insulating film including the contact hole. The silicon layer is grown by a thickness ranging from 500Å to 20000Å from the top portion of the interlayer insulating film. The silicon layer is formed by a selective epitaxial process. The gate includes a polysilicon layer.

The forming-a-metal-silicide-layer may include: forming a metal layer over the silicon layer including the spacer; performing a thermal treatment process on the semiconductor substrate including the metal layer; and removing the metal layer which does not react in the thermal treatment process. The metal layer which does not react in the thermal treatment process includes a metal having a high melting point. The metal having a high melting point includes one selected from titanium (Ti), cobalt (Co), nickel (Ni), tungsten (W) and combinations thereof.

DETAILED DESCRIPTION OF THE SPECIFIC EMBODIMENT

FIGS. 1a to 1d are cross-sectional diagrams illustrating a method for manufacturing a semiconductor device according to an embodiment of the present invention.

Figure 1A:
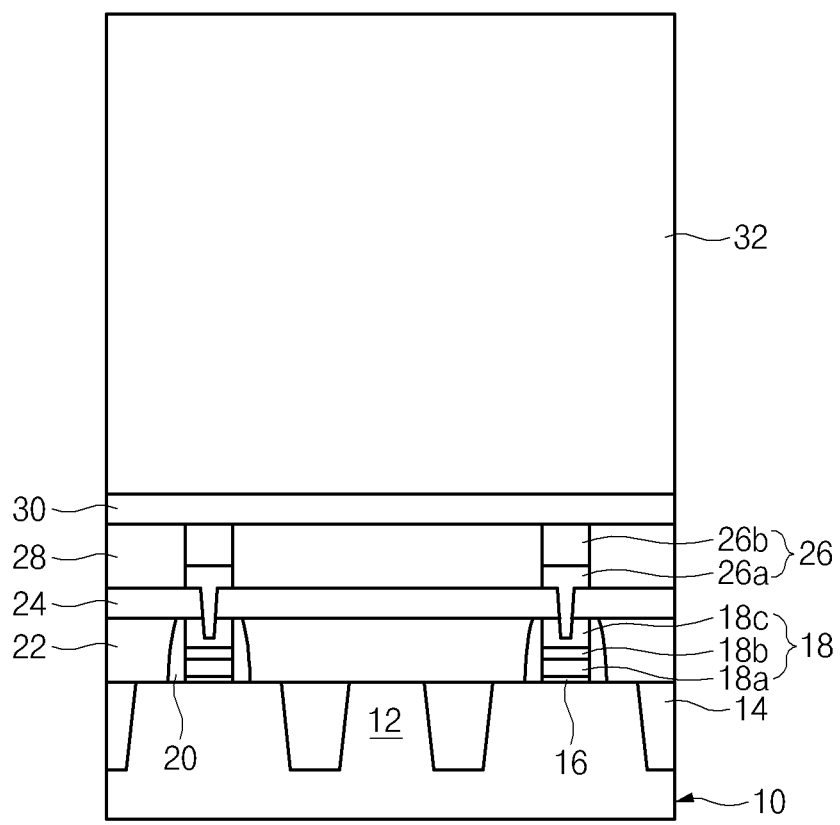
FIGS. 1a to 1d are cross-sectional diagrams illustrating a method for manufacturing a semiconductor device according to an embodiment of the present invention.

Referring to FIG. 1a, a first device isolating film 14 that defines a first active region 12 is formed in a peripheral circuit region of a first semiconductor substrate 10. The first device isolating film 14 is formed by a shallow trench isolation (STI) process.

A first gate insulating film 16 is formed over the first semiconductor substrate 10. A first gate 18 is formed over the gate insulating film 16. The first gate 18 includes a gate polysilicon layer 18a, a gate electrode layer 18b and a gate hard mask layer 18c.

The first gate insulating film 16 includes one selected from the group consisting of an oxide film, a nitride film and combinations thereof. The gate electrode layer 18b includes a tungsten (W) layer or a tungsten silicide ($WSi_x$) layer. The gate hard mask layer 18c includes a nitride film.

A first insulating film (not shown) is formed over the first semiconductor substrate 10 including the first gate 18. The first insulating film is blanket-etched to form a first spacer 20 on both sidewalls of the first gate 18. The first spacer 20 includes a nitride film. A first ion-implanting process is performed to form a first source/drain region (not shown) in the first semiconductor substrate disposed at both sides of the first spacer 20. As a result, a first transistor is formed.

A first interlayer insulating film 22 is formed over the first semiconductor substrate 10 to fill a gap between the first gate 18. A second interlayer insulating film 24 is formed over the first interlayer insulating film 22. The second interlayer insulating film 24 is selectively etched to form a bit line contact hole (not shown) that exposes the first gate 18.

A conductive layer (not shown) is formed over the second interlayer insulating film 24 including the bit line contact hole. A conductive layer is etched by a photo-etching process with a bit line mask (not shown) to form a bit line 26. The bit line 26 includes a bit line polysilicon layer 26a, a bit line electrode layer 26b and a bit line hard mask layer (not shown)

A third interlayer insulating film 28 is formed over the second interlayer insulating film 24 including the bit line 26 to fill a gap between the bit lines 26. An etching barrier film 30 and a fourth interlayer insulating film 32 are formed over the third interlayer insulating film 28. The fourth interlayer insulating film 32 is formed to have a height of a capacitor to be formed in a cell region. Specifically, the fourth interlayer insulating film is formed to have a thickness ranging from about 5000Å to about 20000Å in order to diminish a step difference between the cell region and the peripheral circuit region.

Figure 1B:
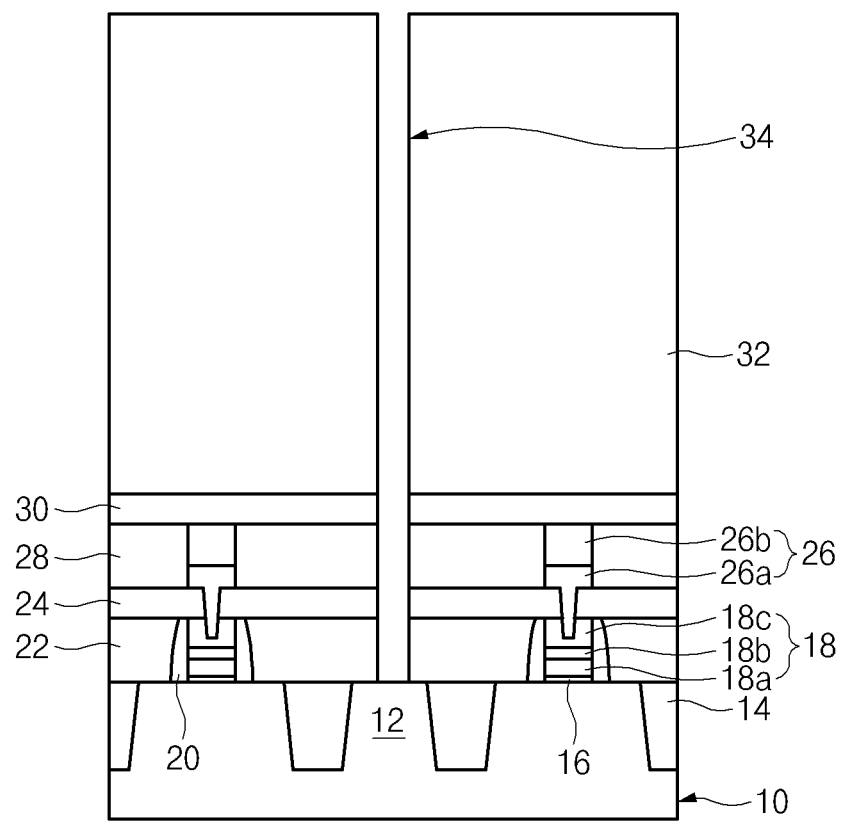

Referring to FIG. 1b, the fourth interlayer insulating film 32, the etching barrier film 30, the third interlayer insulating film 28 and the second interlayer insulating film 24 and the first interlayer insulating film 22 which are disposed between the first gates 18 are selectively etched to form a contact hole 34 that exposes the first active region 12.

Figure 1C:
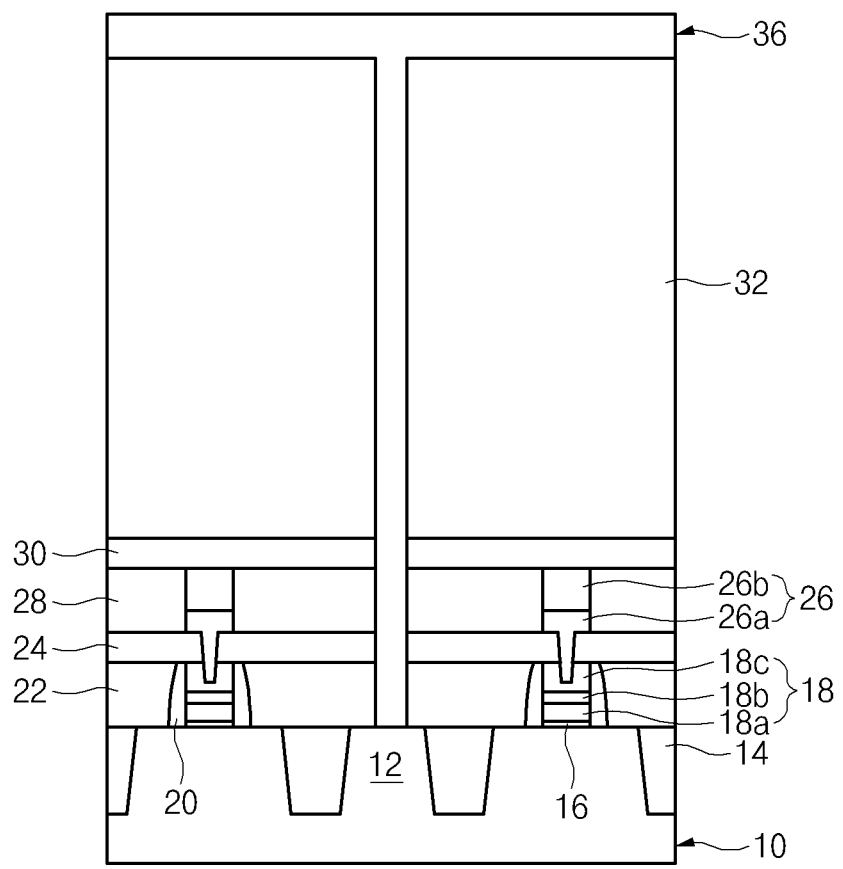

Referring to FIG. 1c, a second semiconductor substrate 36 is formed over the fourth interlayer insulating film 32 to fill the contact hole 34 grown by a selective epitaxial growth (SEG) process with the first active region 12 exposed by the contact hole 34 as a seed layer. Herein, the second semiconductor substrate 36 can be formed by two step process. The second semiconductor substrate 36 is grown to fill a part of the contact hole 34, and re-grown to fill fully the contact hole 34. The second semiconductor substrate 36 is planarized.

The second semiconductor substrate 36 is grown to have a thickness ranging from about 500Å to about 20000Å from the top portion of the fourth interlayer insulating film 32. The semiconductor substrate 36 is planarized by one selected from the group consisting of a chemical mechanical polishing (CMP) process, an etch-back process and combinations thereof.

Figure 1D:
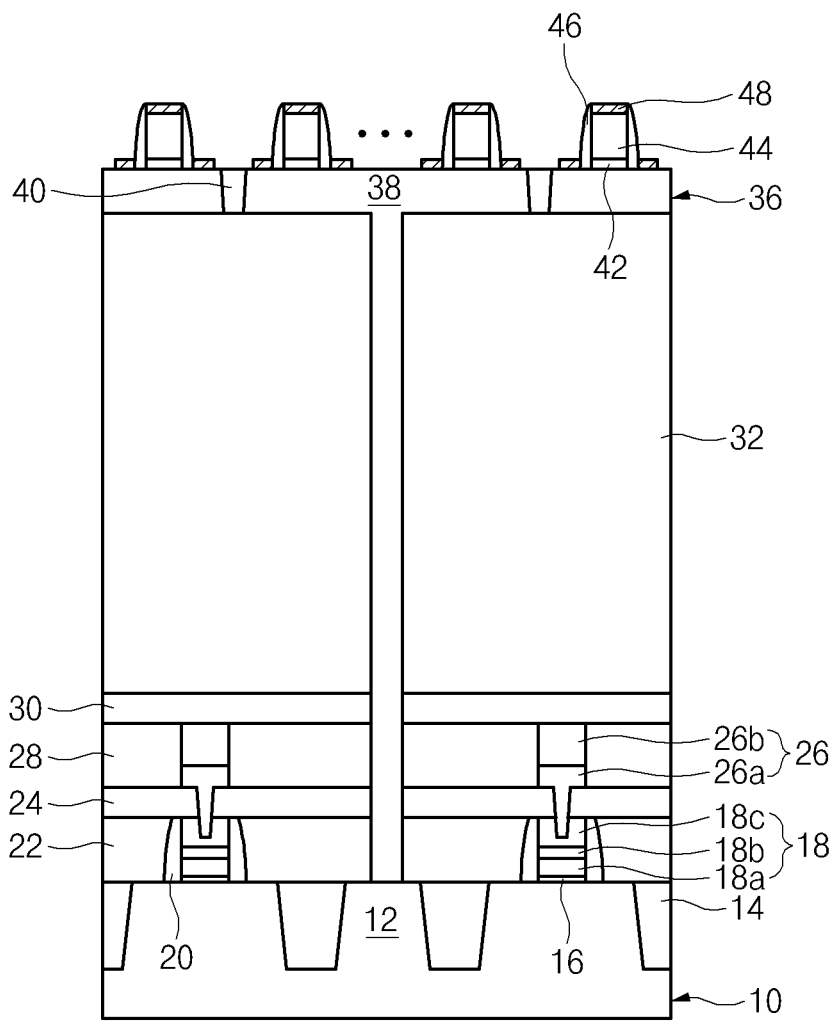

Referring to FIG. 1d, a second device isolating film 40 that defines a second active region 38 is formed in the second semiconductor substrate 36. The second device isolating film 40 is formed by a STI.

A second gate insulating film 42 is formed over the second semiconductor substrate 36 including the second device isolating film 40. The second gate insulating film 42 includes one selected from the group consisting of an oxide film, a nitride film and combinations thereof. The second gate insulating film 42 includes a high dielectric (High-k) material selected from the group consisting of $HfO_2$, $Al_2O_3$, $ZrO_2$, $ZrSiO_4$, $HfSiO_4$, and combinations thereof.

A polysilicon layer (not shown) is formed over the second gate insulating film 42. The polysilicon layer is etched with a gate mask (not shown) by a photo-etching process to form a second gate 44. The second gate 44 has a thickness ranging from about 500Å to about 1500Å.

A second insulating film (not shown) is formed over the second substrate 36 including the second gate 44. The second insulating film is blanket-etched to form a second spacer 46 on both sidewalls of the second gate 44. A second impurity ion-implanting process is performed to form a second source/drain region (not shown) in the second active region 38 disposed at both sides of the spacer 46. As a result, a second transistor is formed.

A metal layer (not shown) is formed over the second semiconductor substrate 36 including the second spacer 46. The metal layer is formed for a salicide process. The metal layer includes a metal having a high melting point selected from titanium (Ti), cobalt (Co), nickel (Ni), tungsten (W), and combinations thereof. The metal layer has a thickness ranging from about 50Å to about 450Å.

A thermal process is performed on the resulting structure including the metal layer to form a metal silicide layer 48 over the second gate 44 and the second source/drain region. The metal layer which does not react in the thermal process is removed. The metal layer which does not react is removed by a wet washing process.

A metal atom of the metal layer reacts with a silicon (Si) atom of the second gate 44 and the second semiconductor substrate 36 by the thermal process to obtain the metal silicide layer 48. The metal silicide layer 48 includes one selected from a titanium silicide layer, a cobalt silicide layer, a nickel silicide layer, a tungsten silicide layer and combinations thereof.

When the second gate insulating film 42 includes a high dielectric material (High-k), the second gate 44 is consist of the metal silicide layer 48. The metal silicide layer 48 formed after the thermal process is formed with the metal layer to have a ratio of 1:3. For example, when the metal layer is formed to have a thickness of 100Å, the metal silicide layer 48 has a thickness of 300Å. That is, the thickness of the metal layer is adjusted to react all polysilicon of the second gate 44, so that the second gate 44 includes the metal silicide layer only.

As described above, according to an embodiment of the present invention, a method for manufacturing a semiconductor device may include forming a transistor to have a stacked structure in a peripheral circuit region to increase net die. The method may also include forming a metal silicide layer over a gate of a transistor formed over an upper layer in a peripheral circuit region, forming a metal silicide layer over a source/drain region of a transistor formed over an upper layer in a peripheral circuit region, and forming a gate insulating film including a high dielectric (Hi-K) material of a transistor formed over an upper layer in a peripheral circuit region to improve performance of the transistor.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
   forming a first active region in a peripheral cell region of a semiconductor substrate;
   forming a first gate on the first active region;
   forming a first interlayer insulating film over the semiconductor substrate including the first gate;
   forming a second interlayer insulating film over the first interlayer insulating film;
   etching the second interlayer insulating film to form a bit line contact over the first gate;
   forming a bit line over the bit line contact;
   forming a third interlayer insulating film over the second interlayer insulating film and the bit line;
   forming a fourth interlayer insulating film over the third interlayer insulating film;
   forming a contact hole exposing the first active region by penetrating between and including the first interlayer insulating film and the fourth interlayer insulating film;

growing the exposed first active region to partially fill the contact hole;

re-growing the grown first active region to fully fill the contact hole and form a second active region over the fourth interlayer insulating film, wherein the second active region is connected to the first active region;

forming a second gate having sidewalls on the second active region;

forming a spacer having two sides at the sidewalls of the second gate;

forming a source/drain region in the second active region of both sides of the spacer; and forming a silicide layer on the second gate and the source/drain region.

2. The method according to claim 1, wherein the second active region includes a silicon layer.

3. The method according to claim 2, comprising forming the silicon layer to have a thickness in a range of from 500 Å to 20000 Å at a top surface of the fourth interlayer insulating film.

4. The method according to claim 1, further comprising forming a gate insulating layer between the second active region and the second gate.

5. The method according to claim 1, wherein the second gate includes a polysilicon layer.

6. The method according to claim 1, comprising forming the silicide layer by:

forming a metal layer on the second gate, the spacer, the source/drain region, and the second active region;

performing a thermal process on the metal layer; and removing the metal layer remaining after the thermal process.

7. The method according to claim 4, wherein the gate insulating layer includes one selected from the group consisting of $HfO_2$, $Al_2O_3$, $ZrO_2$, $ZrSiO_4$, $HfSiO_4$, and combinations thereof.

8. The method according to claim 6, wherein the metal layer includes one selected from the group consisting of titanium, cobalt, nickel, tungsten, and combinations thereof.

9. The method according to claim 6, comprising removing the metal layer remaining after the thermal process by wet etching.

* * * * *